(12) United States Patent
Hsu et al.

(10) Patent No.: US 7,190,623 B2
(45) Date of Patent: Mar. 13, 2007

(54) NON-VOLATILE MEMORY CELL AND METHOD OF OPERATING THE SAME

(75) Inventors: Ching-Hsiang Hsu, Hsin-Chu (TW);
Shih-Jye Shen, Hsin-Chu (TW);
Hsin-Ming Chen, Tainan Hsien (TW);
Hai-Ming Lee, Taipei (TW)

(73) Assignee: eMemory Technologies Inc., Hsin-Chu (TW)

( * ) Notice: Subject to any disclaimer, the term of this patent is extended or adjusted under 35 U.S.C. 154(b) by 0 days.

(21) Appl. No.: 11/161,951

(22) Filed: Aug. 23, 2005

(65) Prior Publication Data

US 2005/0282332 A1    Dec. 22, 2005

Related U.S. Application Data

(63) Continuation-in-part of application No. 10/905,056, filed on Dec. 13, 2004, and a continuation-in-part of application No. 10/707,700, filed on Jan. 5, 2004, now Pat. No. 6,975,545.

(30) Foreign Application Priority Data

Nov. 6, 2003    (TW) .............................. 92131056 A

(51) Int. Cl.
G11C 16/04    (2006.01)

(52) U.S. Cl. ........................... 365/185.28; 365/185.14; 365/185.26

(58) Field of Classification Search ............ 365/185.28
See application file for complete search history.

(56) References Cited

U.S. PATENT DOCUMENTS

| | | | |
|---|---|---|---|
| 5,586,073 A | 12/1996 | Hiura et al. | |
| 6,114,724 A * | 9/2000 | Ratnakumar | 365/185.18 |
| 6,215,700 B1 | 4/2001 | Fong et al. | |
| 6,433,382 B1 * | 8/2002 | Orlowski et al. | 257/315 |
| 6,750,102 B1 | 6/2004 | Lancaster | |
| 6,798,014 B2 | 9/2004 | Schloesser et al. | |
| 6,861,701 B2 | 3/2005 | Williams et al. | |
| 6,870,765 B2 | 3/2005 | Fujiwara | |
| 2002/0020872 A1 | 2/2002 | Cremonesi et al. | |
| 2003/0227049 A1 | 12/2003 | Sakakibara | |
| 2004/0005764 A1 | 1/2004 | Wu et al. | |
| 2004/0235246 A1 | 11/2004 | Wu et al. | |

* cited by examiner

Primary Examiner—Thong Q. Le
(74) Attorney, Agent, or Firm—Winston Hsu

(57) ABSTRACT

A memory cell includes an N-type well, three P-type doped regions formed on the N-type well, a dielectric layer formed on the N-type well and between a first doped region and a second doped region of the three P-type doped regions, a first gate formed on the dielectric layer, a charge storage structure formed on the N-type well and between the second doped region and a third doped region of the three P-type doped regions, and a second gate formed on the charge storage structure. Data is stored in the memory cell by injecting electrons based on the channel-hot-hole induced hot-electron injection mechanism, the band-to-band tunneling induced electron injection mechanism and the Fowler-Nordheim tunneling mechanism. Data is erased from the memory cell by ejecting electrons based on the Fowler-Nordheim tunneling mechanism. Whether data is stored in the charge storage structure or not can be distinguished by read operation.

29 Claims, 15 Drawing Sheets

| Operating voltages | First gate | Second gate | First doped region | Third doped region | N-type well |
|---|---|---|---|---|---|
| First embodiment | -5V | -1V | 0V | -5V | 0V |
| Second embodiment | 0V | 4V | 5V | 0V | 5V |

Fig. 6

| Operating voltages | First gate | Second gate | First doped region | Third doped region | N-type well |
|---|---|---|---|---|---|
| Method 1 | 0V | 2V | 0V | -5V | 0V |
| Method 2 | 5V | 7V | 5V | 0V | 5V |
| Method 3 | 0~5V | 7V | Floating | 0V | 5V |

Fig. 9

| Operating voltages | First gate | Second gate | First doped region | Third doped region | N-type well |
|---|---|---|---|---|---|
| Method 1 | 0~5V | 10V | 0V | 0V | 0V |
| Method 2 | 0~5V | 10V | Floating | 0V | 0V |
| Method 3 | 0~5V | 10V | 0V | Floating | 0V |
| Method 4 | 0~5V | 10V | Floating | Floating | 0V |

Fig. 11

| Operating voltages | First gate | Second gate | First doped region | Third doped region | N-type well |
|---|---|---|---|---|---|
| Method 1 | 0~5V | -5V | 5V | 5V | 5V |
| Method 2 | 0~5V | -5V | 5V | Floating | 5V |
| Method 3 | 0~5V | -5V | Floating | Floating | 5V |

Fig. 13

| Operating voltages | First gate | Second gate | First doped region | Third doped region | N-type well |
|---|---|---|---|---|---|
| Method 1 | 0V | 2~5V | 3.3V | 1.8V | 3.3V |

Fig. 15

NON-VOLATILE MEMORY CELL AND METHOD OF OPERATING THE SAME

CROSS REFERENCE TO RELATED APPLICATIONS

This application claims the benefit of U.S. non-provisional application Ser. No. 10/707,700, filed on Jan. 5, 2004 now U.S. Pat. No. 6,975,545 and Ser. No. 10/905,056, filed on Dec. 13, 2004.

BACKGROUND OF THE INVENTION

1. Field of the Invention

The present invention relates to a non-volatile memory cell and method of operating the same, and more specifically, to a non-volatile memory cell having two transistors and a method of writing, erasing, and reading the same.

2. Description of the Prior Art

Non-volatile memory can store data even without a power supply, and so it is widely used in various portable electronic products such as personal digital assistants (PDAs), mobile phones, and memory cards. In order to respond to these requirements, non-volatile memory technology aims for compatibility with CMOS processing, low power consumption, high writing efficiency, low cost, and high density. However, as non-volatile memory becomes smaller in size, its gate oxide layer becomes accordingly thinner so that stored data vanishes easily, which causes a problem in the data storing ability of non-volatile memory.

Please refer to FIG. 1 showing a conventional memory cell 10. The memory cell 10 includes an N-channel metal oxide semiconductor (NMOS) transistor 28 and a P-channel metal oxide semiconductor (PMOS) transistor 30 separated by an insulating field oxide layer (FOX) 24. The NMOS transistor 28 is formed on a P-type substrate 12 and includes a first floating gate 32, an $N^+$ source doped region 14, and an $N^+$ drain doped region 16. The PMOS transistor 30 is formed on an N-type substrate 18 and includes a second floating gate 34, a $P^+$ source doped region 20, and a $P^+$ drain doped region 22. The PMOS transistor 30 is implanted with a heavily doped N-type channel stop region 38 under the second floating gate 34, adjacent to the $P^+$ source doped region 20. The first floating gate 32 and the second floating gate 34 are connected with a floating gate conductive line 36 so that both are kept at the same level. When writing data into the memory cell 10, the first floating gate 32 generates a corresponding level according to a control gate voltage. At this time, the second floating gate 34 has the same level as the first floating gate 32 because of the connection by the floating gate conductive line 36. Then, the electrons in a depletion region between the $P^+$ source doped region 20 and the N-type channel stop region 38 are accelerated and injected into the second floating gate 34.

However, the conventional memory cell 10 has disadvantages as follows. First, the conventional memory cell 10 comprises the PMOS transistor 30 and the NMOS transistor 28 which occupy a large amount of chip area. Second, the conventional memory cell 10 requires the floating gate conductive line 36 for connecting the first floating gate 32 and the second floating gate 34. Moreover, the field oxide layer 24 is required to separate the PMOS transistor 30 from the NMOS transistor 28. Therefore, the conventional memory cell 10 occupies considerable chip area and is structurally complicated, all of which increase the cost and difficulties in the manufacturing process.

SUMMARY OF THE INVENTION

It is therefore a primary objective of the present invention to provide a memory cell and a method for operating the same in order to solve the problems mentioned above.

The claimed invention discloses a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between the second and third doped regions of the three P-type doped regions, and a second gate formed on the charge storage structure.

The claimed invention further discloses a method for writing to a memory cell comprising providing a memory cell comprising an N-type well, three P-type doped regions formed on the N-type well, a dielectric layer comprising silicon dioxide and formed on the N-type well and between a first and second doped regions of the three P-type doped regions, a first gate formed on the dielectric layer, a charge storage structure formed on the N-type well and between second and third doped regions of the three P-type doped regions, and a second gate formed on the charge storage structure; applying a first voltage to the first gate and a second voltage to the second gate for slightly or fully conducting the first and second doped regions; applying a third voltage to the N-type well and a fourth voltage to the first doped region; and applying a fifth voltage to the third doped region for injecting electrons in a P-type channel of the second and third doped regions into the charge storage structure by channel-hot-hole induced hot-electron injection.

The claimed invention further discloses another method for writing to a memory cell comprising providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure; applying a first voltage to the first gate and a second voltage to the second gate; applying a voltage to the N-type well; applying a third voltage to the first doped region; adjusting the first voltage for turning off a P-type channel between the first and second doped regions, or for providing the first doped region with a floating voltage level, wherein no current flows through the P-type channel between the first and second doped regions when the third voltage is applied to the first doped region; and applying a voltage smaller than the second voltage to the third doped region, thereby generating a horizontal electric field for accelerating electrons generated in the third doped region by band-to-band tunneling mechanism and providing the electrons with sufficient energy required for entering a P-type channel between the second and third doped regions, and for injecting electrons into the charge storage structure by electron-hole pairs resulting from electrons impacting the P-type channel between the second and third doped regions.

The claimed invention further discloses another method for writing to a memory cell comprising providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure; applying voltages to the N-type well, the first and the third doped regions, respectively; applying a first voltage to the first gate for turning off a P-type channel between the first and second doped regions; and applying a second voltage to the second gate for providing the charge storage structure with a sufficient electrical field to attract electrons in a P-type channel between the second and third doped regions, and for tunneling electrons in the P-type channel between the second and third doped regions into the charge storage structure by Fowler-Nordheim tunneling, wherein the second voltage is larger than the voltage applied to the N-type well.

The claimed invention further discloses a method for erasing a memory cell comprising providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure; applying voltages to the N-type well, the first and the third doped regions, respectively; applying a first voltage to the first gate; and applying a second voltage to the second gate for conducting a P-type channel between the second and third doped regions and establishing a voltage difference between the second gate and the N-type well for erasing electrons from the charge storage structure by Fowler-Nordheim tunneling, wherein the second voltage is smaller than the voltage applied to the N-type well.

The claimed invention further discloses a method for reading a memory cell comprising providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure; applying voltages to the N-type well, the first and the third doped regions, wherein the first and third doped regions have different voltages; applying a first voltage to the first gate for conducting a P-type channel between the first and second doped regions; and applying a second voltage to the second gate, wherein the second voltage is set in a way such that whether or not electrons are stored in the charge storage structure can be determined when reading the memory cell.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a table listing operating voltages adopted in the first and second embodiments of the present invention.

FIG. 9 is a table listing operating voltages adopted in the fourth embodiment of the present invention.

FIG. 11 is a table listing operating voltages adopted in the fifth embodiment of the present invention.

FIG. 13 is a table listing operating voltages adopted in the sixth embodiment of the present invention.

FIG. 15 is a table listing operating voltages adopted in the seventh embodiment of the present invention.

DETAILED DESCRIPTION

Figure 1:
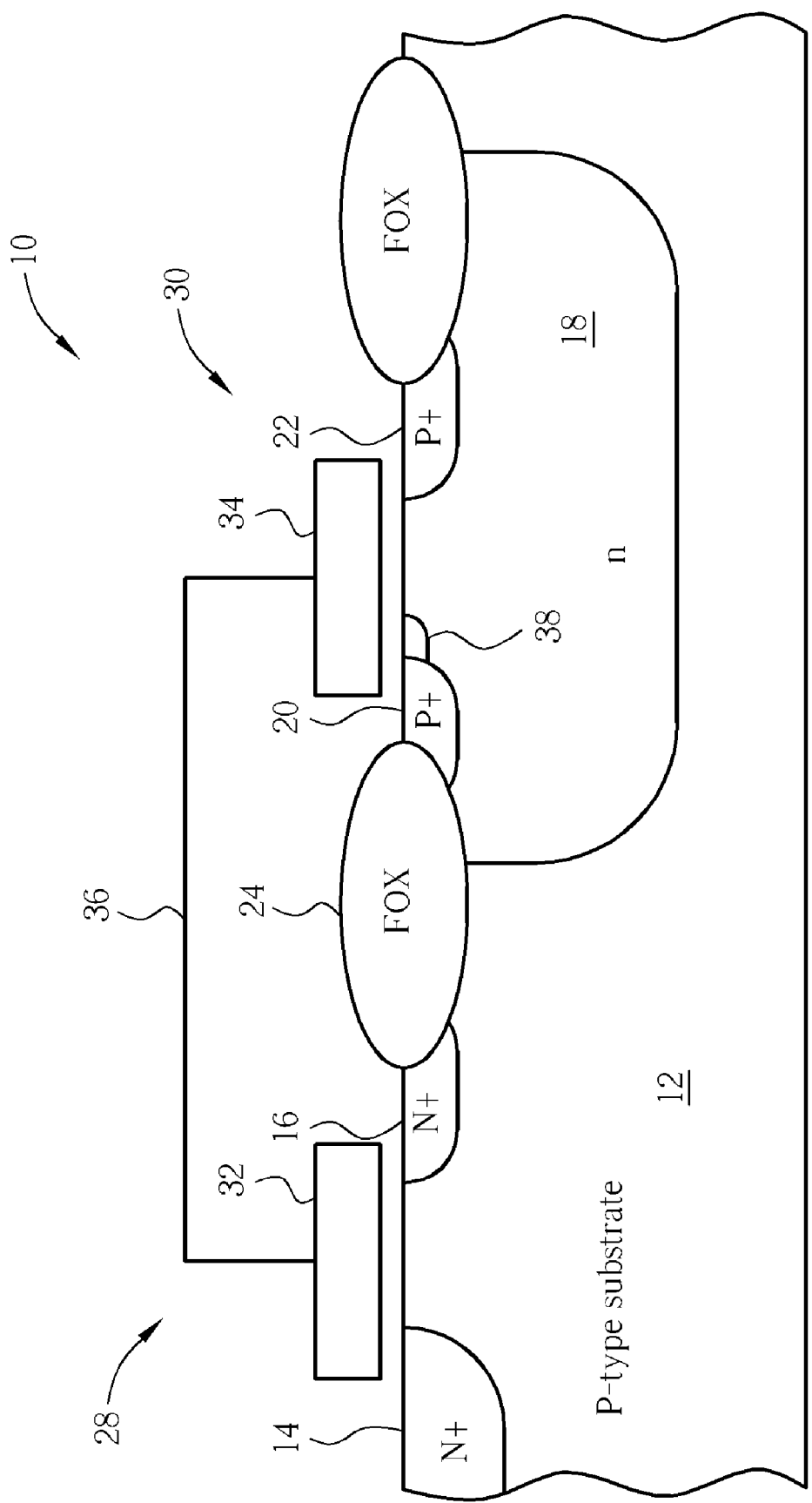
FIG. 1 shows a conventional memory cell.
Figure 2:
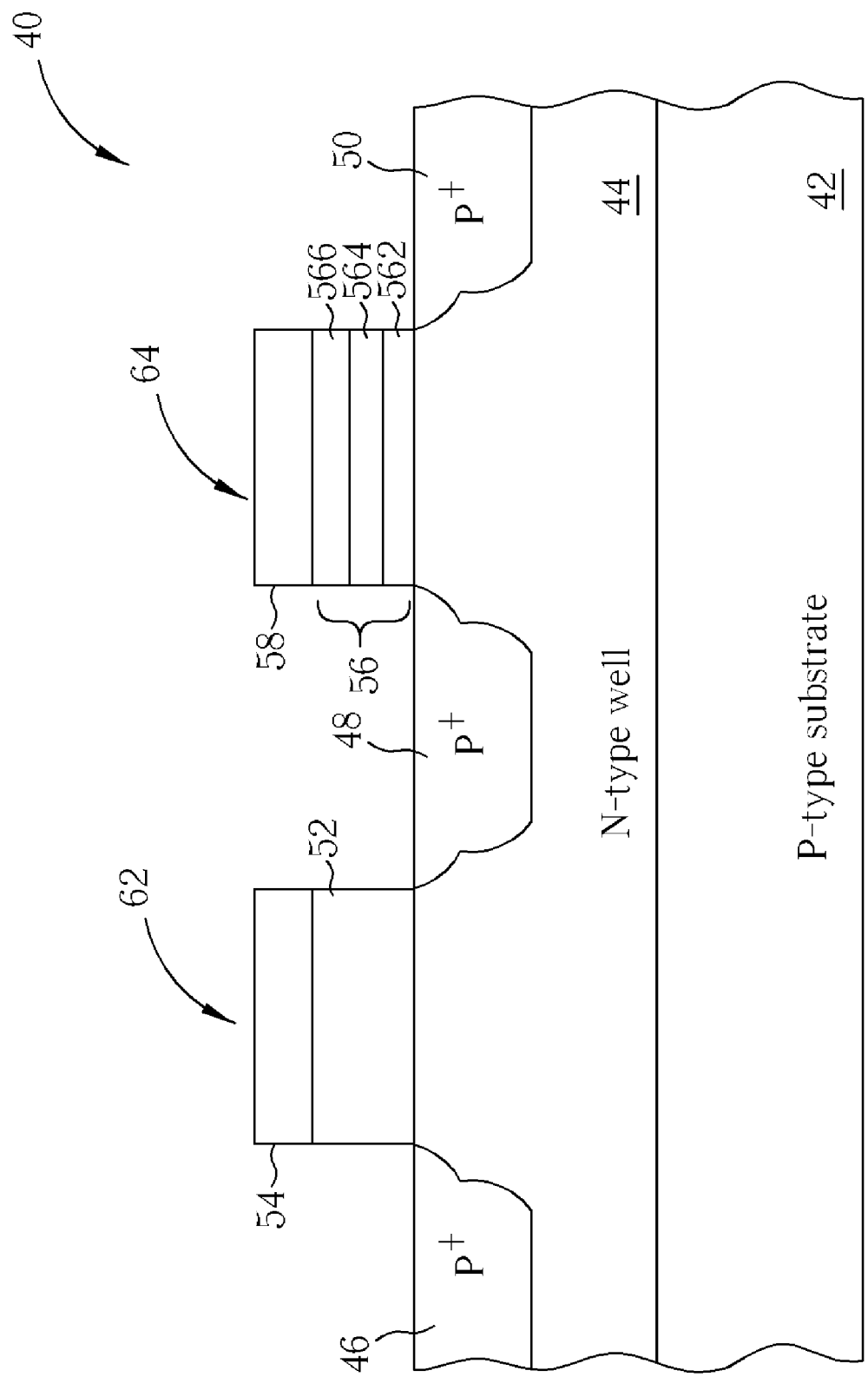
FIG. 2 shows a memory cell according to the present invention.
Figure 3:
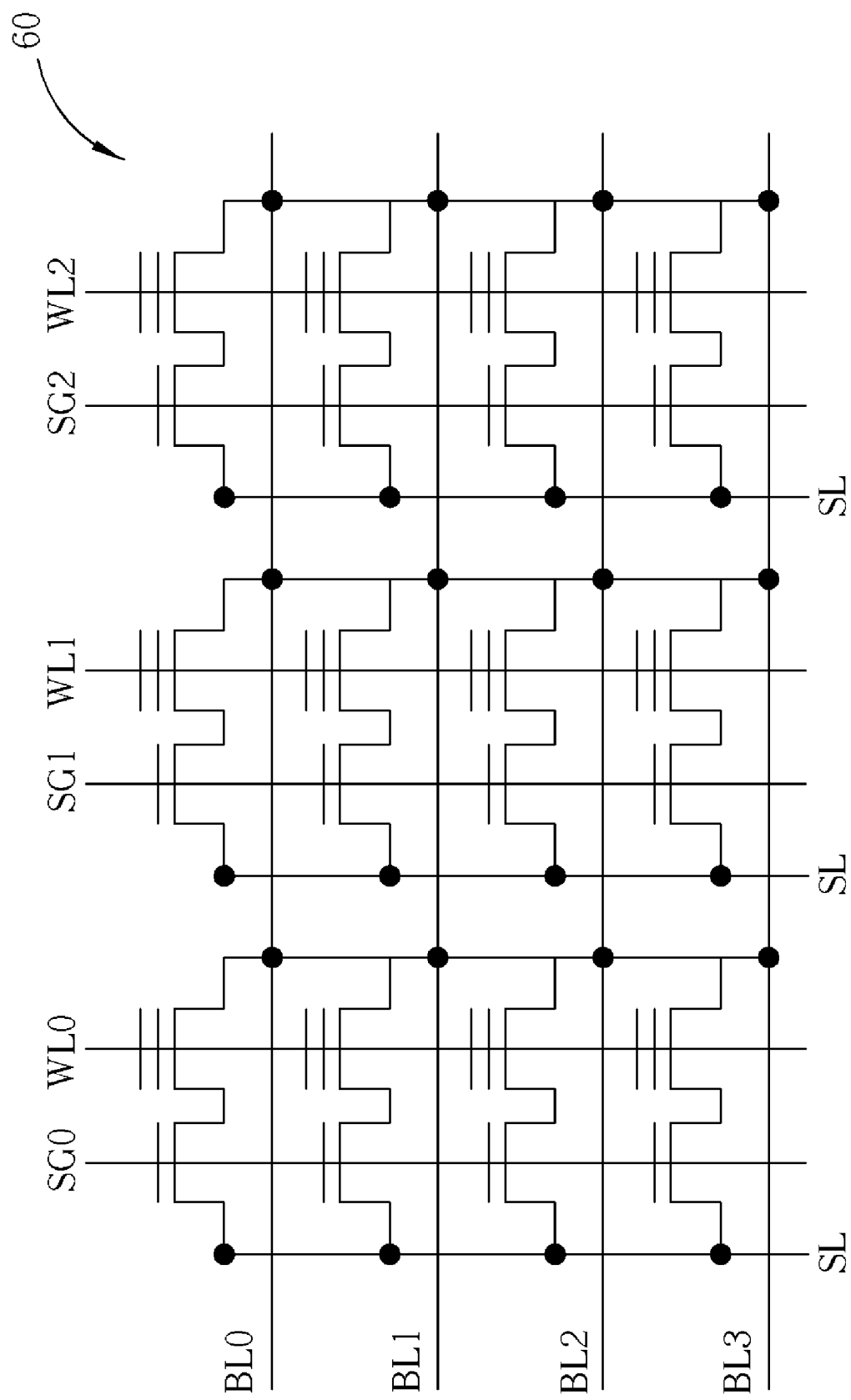
FIG. 3 shows a memory module comprising the memory cell shown in FIG. 2.

Please refer to FIG. 2 and FIG. 3. FIG. 2 shows a memory cell 40 according to the present invention, and FIG. 3 shows a memory module 60 comprising memory cells 40 shown in FIG. 2. The memory cell 40 includes a P-type substrate 42, an N-type well 44, three P-type doped regions 46, 48, 50, a dielectric layer 52, a first gate 54, a charge storage structure 56, and a second gate 58. The N-type well 44 is formed on the P-type substrate 42, the three P-type doped regions 46, 48, 50 are formed on the N-type well 44, the dielectric layer 52 is formed on the N-type well 44 and between the first doped region 46 and the second doped region 48 of the three doped regions, the first gate 54 is formed on the dielectric layer 52, the charge storage structure 56 is formed on the N-type well 44 and between the second doped region 48 and the third doped region 50 of the three doped regions, and the second gate 58 is formed on the charge storage structure 56. The first gate 54 and the second gate 58 can be poly-silicon layers, policide metal layers, or metal layers. The charge storage structure 56 includes a charge storage layer 564 and silicon dioxide (SiO2) layers 562 and 566. The charge storage layer 564 can comprise either silicon nitride ($Si_3N_4$) or silicon oxynitride ($Si_xN_yO_z$), and the dielectric layer 52 can have a single-layer structure comprising silicon dioxide. The first gate 54, the dielectric layer 52, the first doped region 46, and the second doped region 48 form a select transistor 62 for turning on and off the memory cell 40. The second gate 58, the charge storage structure 56, the second doped region 48, and the third doped region 50 form a storage transistor 64 for storing data in the memory cell 40.

In actual applications, the memory cells 40 are aligned to create the memory module 60. As shown in FIG. 3, the memory module 60 comprises a plurality of memory cells 40. These memory cells 40 are aligned in form of an NOR-array, in which the first gates 54 of the memory cells on the same column are coupled to same select gate lines (SG0, SG1, SG2), the second gates 58 of the memory cells on the same column are coupled to same word lines (WL0, WL1, WL2), the third doped regions 50 of the memory cells on the same row are coupled to same bit lines (BL0, BL1, BL2), and the first doped regions 46 of all the memory cells are coupled to a same source line (SL).

Figure 4:
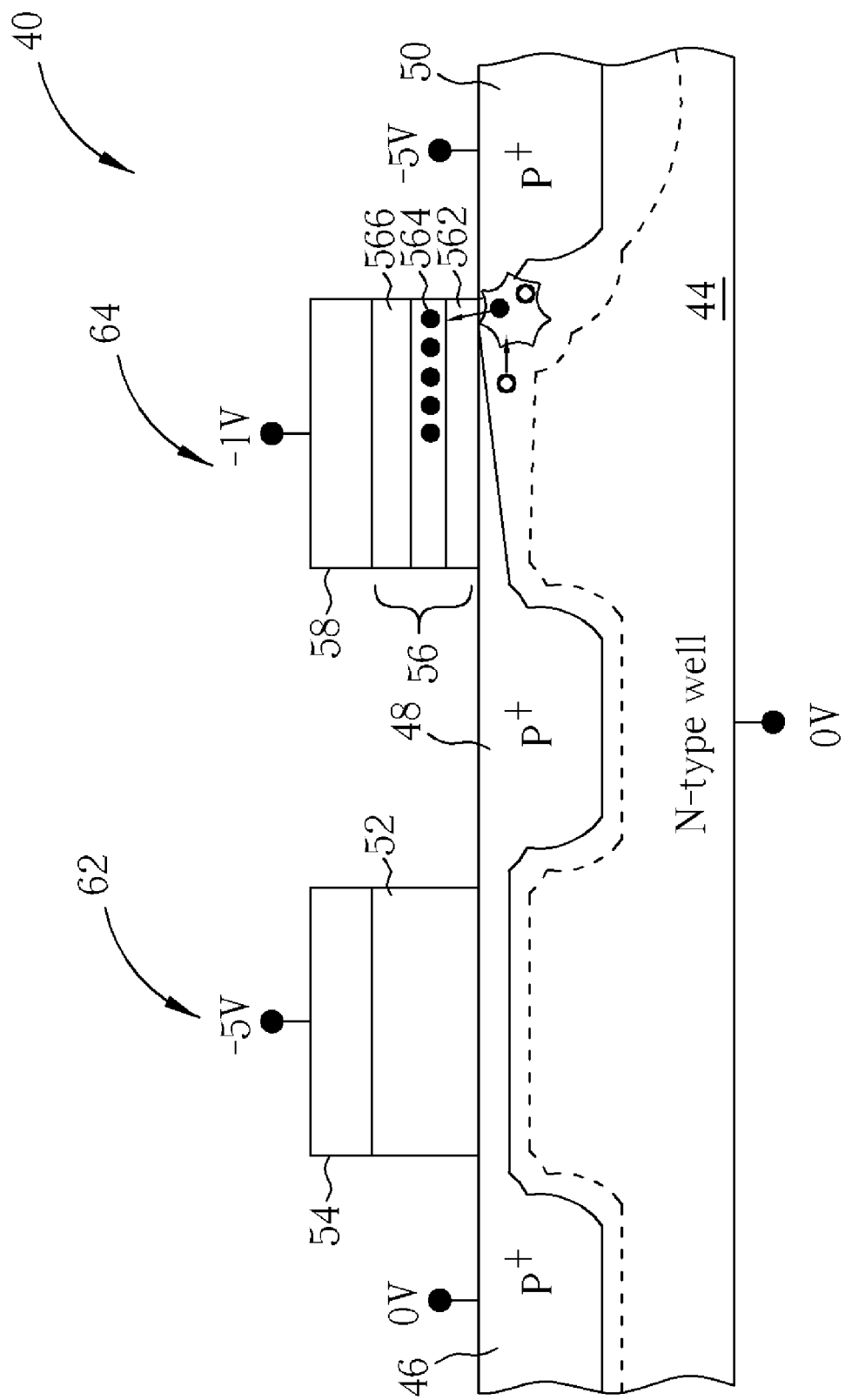
FIG. 4 is a diagram illustrating a method of writing to a memory cell according to a first embodiment of the present invention.

Please refer to FIG. 4 for a diagram illustrating a first embodiment according to the present invention. In the first embodiment of the present invention, the writing operation of the memory cell 40 injects electrons into the charge storage layer 564 of the storage transistor 64 by the channel-hot-hole induced hot-electron injection mechanism. Before writing data into the memory cell 40, the select transistor 62 of the memory cell 40 is first turned on by applying 0V to the N-type well 44 and –5V to the first gate 54 so as to conduct a P-type channel between the first doped region 46 and the second doped region 48. When writing data into the memory cell 40, a voltage of –1V is applied to the second gate 58, 0V to the first doped region 46, and –5V to the third doped region 50. Since the P-type channel between the first doped region 46 and the second doped region 48 is conducting, the first and second doped regions 46 and 48 have almost the same voltage level. Holes in a P-type channel between the second doped region 48 and the third doped region 50 are accelerated by an electric field and obtain high energy. Then, electron-hole pairs are generated as a result of the high-energy holes impacting the N-type well 44. The electrons generated as a result of the above-mentioned impact are attracted by the voltage applied to the second gate 58 and injected into the charge storage layer 564 of the storage transistor 64.

Figure 5:
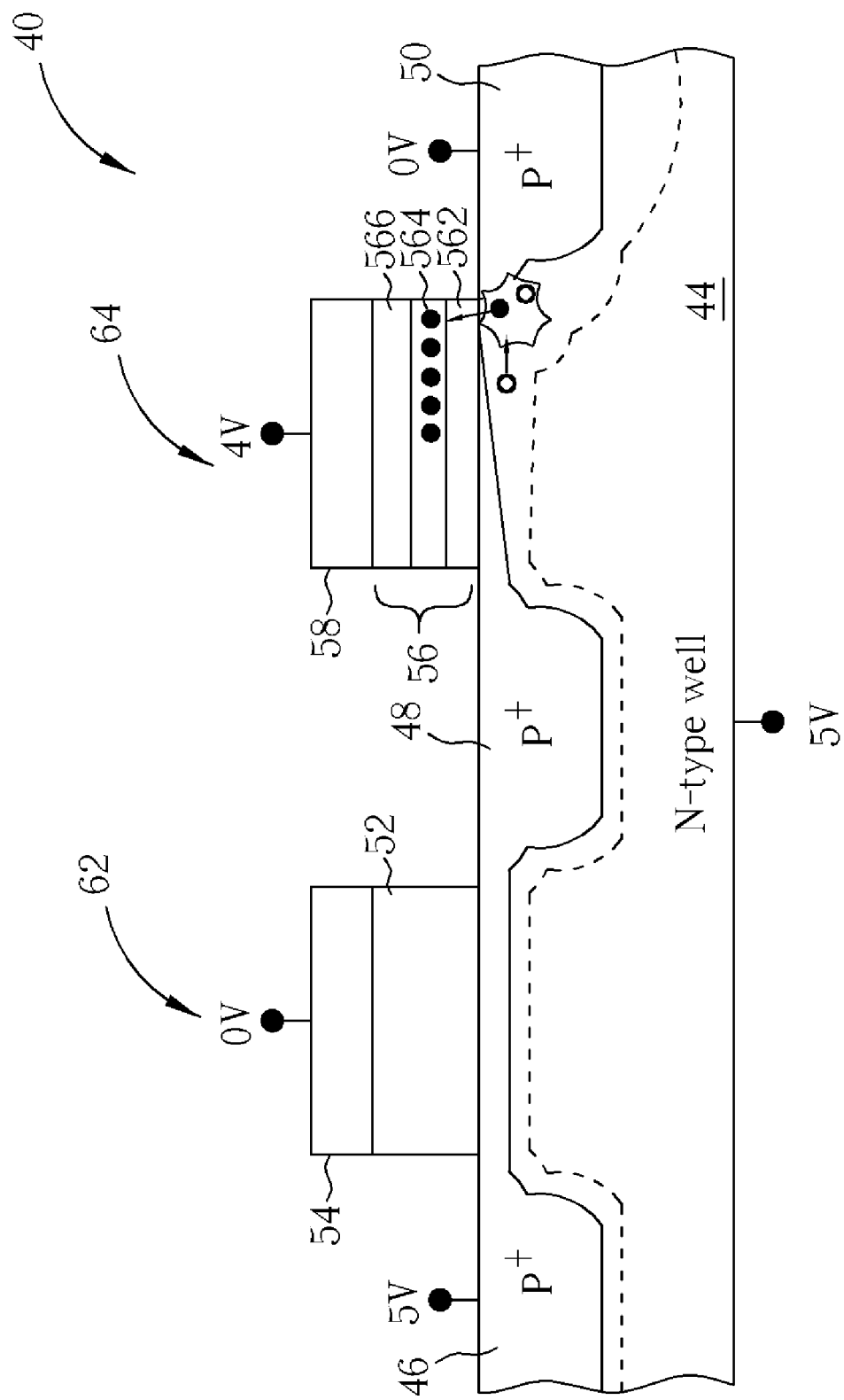
FIG. 5 is a diagram illustrating a method of writing to a memory cell according to a second embodiment of the present invention.

Please refer to FIG. 5 for a diagram illustrating a second embodiment according to the present invention. In the second embodiment of the present invention, the writing operation of the memory cell 40 injects electrons into the charge storage layer 564 of the storage transistor 64 by the channel-hot-hole induced hot-electron injection mechanism, similar to the first embodiment illustrated in FIG. 4. The difference is that the second embodiment adopts operating voltages, each of which is 5V higher than its corresponding operating voltage adopted in the first embodiment. Therefore, all operating voltages used in the second embodiment are higher than ground level, resulting in easier chip implementation. In the second embodiment, before writing data into the memory cell 40, a voltage of 5V is applied to the N-type well 44 and 0V to the first gate 54 for turning on the select transistor 62 of the memory cell 40 and conducting the P-type channel between the first doped region 46 and the second doped region 48. When writing data into the memory cell 40, a voltage of 4V is applied to the second gate 58, 5V to the first doped region 46, and 0V to the third doped region 50. Since the P-type channel between the first doped region 46 and the second doped region 48 is conducting, the first doped region 46 and the second doped region 48 have the same voltage level. Holes in the P-type channel between the second doped region 48 and the third doped region 50 are accelerated by an electric field and obtain high energy. Then, electron-hole pairs are generated as a result of the high-energy holes impacting the N-type well 44. The electrons generated as a result of the above-mentioned impact are attracted by the voltage applied to the second gate 58 and injected into the charge storage layer 564 of the storage transistor 64.

Please refer to FIG. 6 for a table listing detailed operating voltages adopted in the first and second embodiments according to the present invention. The first and second embodiments are both based on the channel-hot-hole induced hot-electron injection mechanism.

Figure 7:
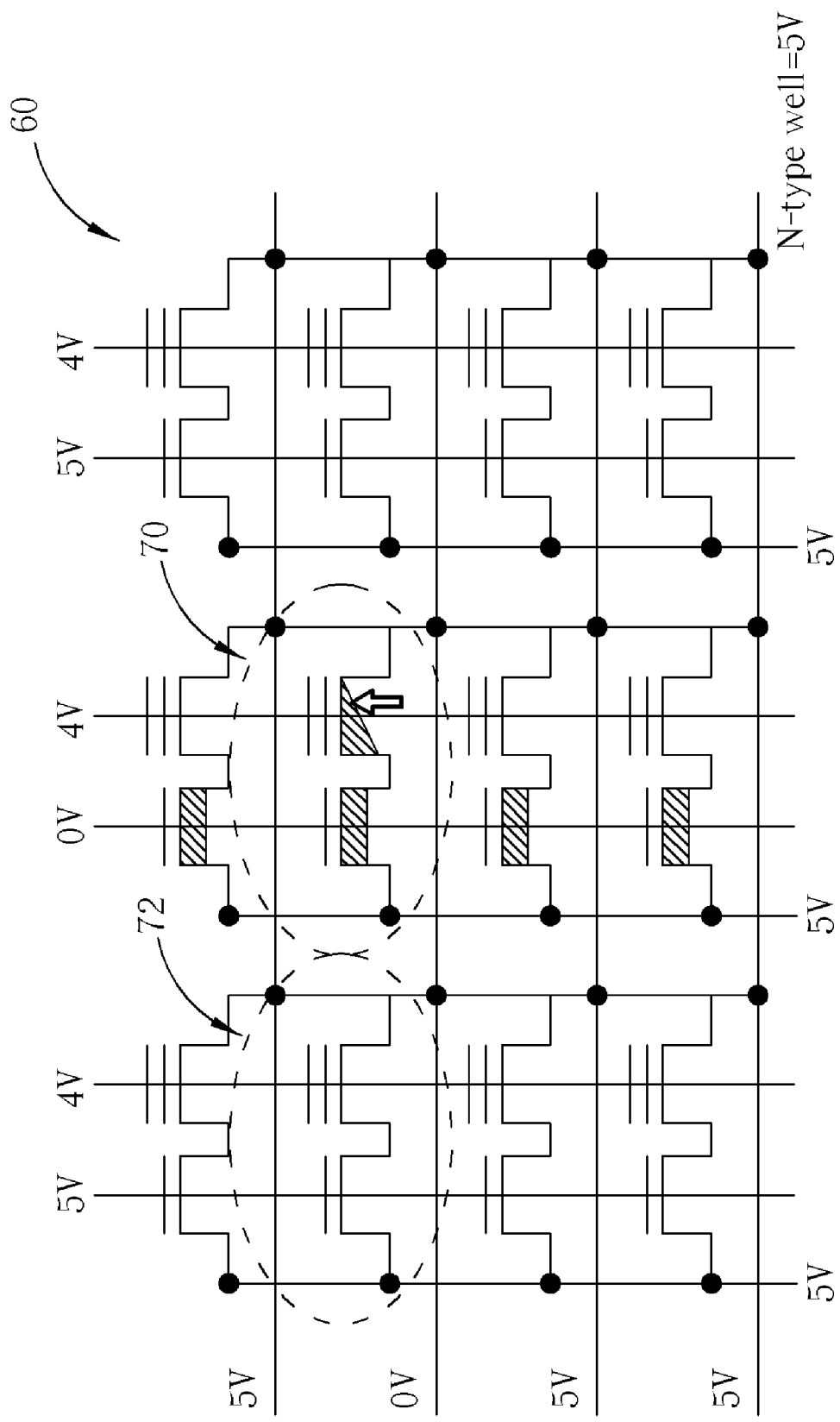
FIG. 7 is a diagram illustrating a method of writing to a memory module according to a third embodiment of the present invention.

Please refer to FIG. 7 for a diagram illustrating a third embodiment according to the present invention. The writing operation of the memory module 60 is similar to that of the memory cell 40 in the second embodiment in that voltages applied to the first gate 54, the second gate 58, the first doped region 46, and the third doped region 50 of the memory cell 40 in the second embodiment are applied respectively to the select gate lines (SG0, SG1, SG2), the word lines (WL0, WL1, WL2), the source line (SL) and the bit lines (BL0, BL1, BL2) in the third embodiment. When writing data into the memory module 60, a memory cell 70 is first chosen, and then a voltage of 5V is applied to the N-type well 44 of the memory cell 70, 0V to the select gate line SG1 coupled to the memory cell 70, 5V to the select gate lines SG0 and SG2 not coupled to the memory cell 70, 4V to all the word lines WL0, WL1 and WL2, 5V to the source line SL, 0V to the bit line BL1 coupled to the memory cell 70, and 5V to the bit lines BL0, BL2 and BL3 not coupled to the memory cell 70. When writing data into the memory module 60, the gate voltage of the select transistor 62 of a memory cell 72 into which data is not written is 5V, and the select transistor 62 of the memory cell 72 remains off. Therefore, the third embodiment of the present invention does not cause any write interference when writing data into the memory cell 70.

Figure 8:
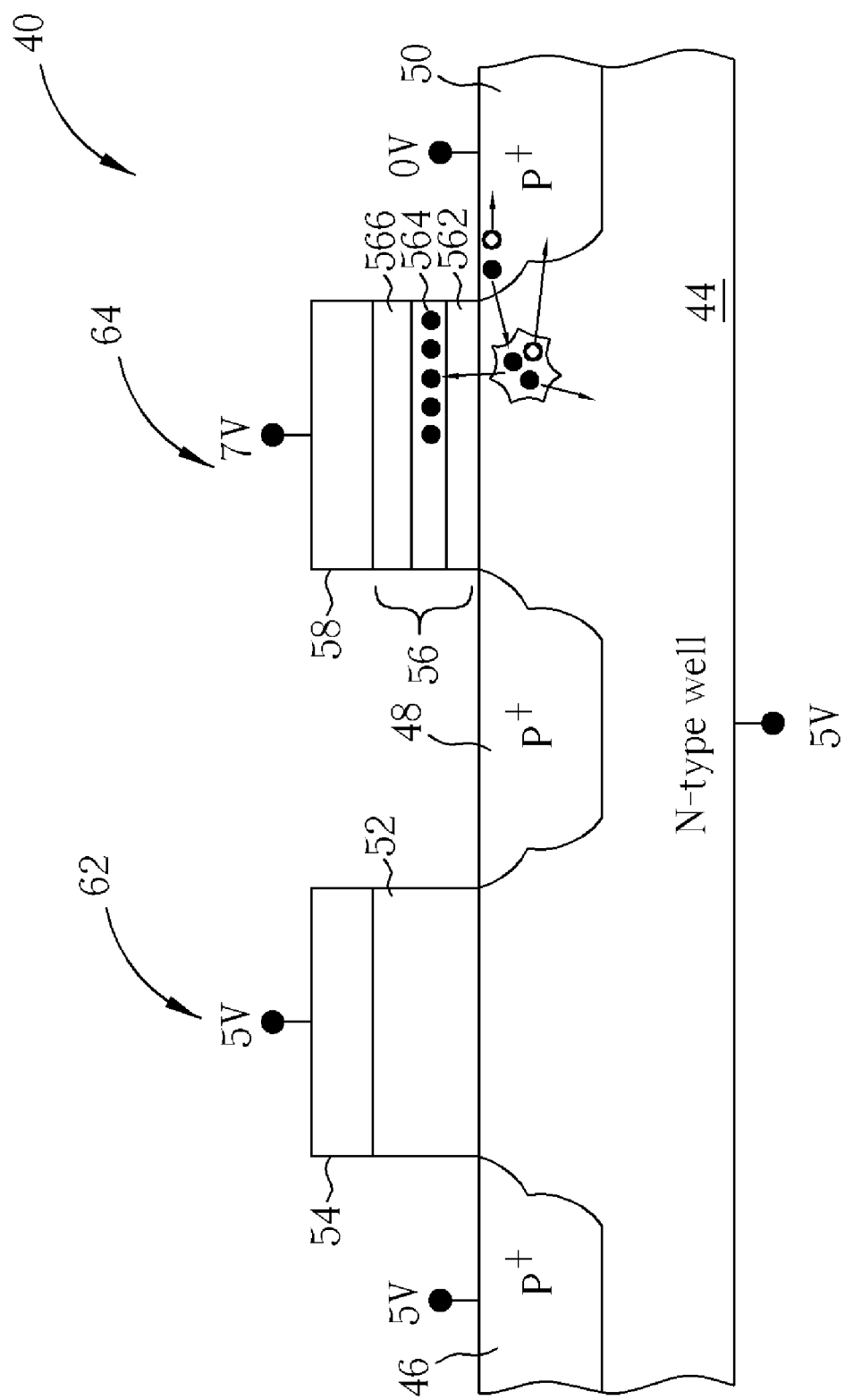
FIG. 8 is a diagram illustrating a method of writing to a memory cell according to a fourth embodiment of the present invention.

Please refer to FIG. 8 for a diagram illustrating a fourth embodiment according to the present invention. In the fourth embodiment of the present invention, the writing operation of the memory cell 40 injects electrons into the charge storage layer 564 of the storage transistor 64 by the band-to-band tunneling induced electron injection mechanism. Before writing data into the memory cell 40, the select transistor 62 of the memory cell 40 is first turned off by applying 5V to the N-type well 44, the first gate 54 and the first doped region 46. Thus, the P-type channel between the first doped region 46 and the second doped region 48 is not conducting and the second doped region 48 remains floating. Then, a voltage of 7V is applied to the second gate 58, and 0V is applied to the third doped region 50. The positive voltage applied to the second gate 58 results in an electric field in the perpendicular direction, which in turn bends the energy band of an overlap region between the third doped region 50 and the second gate 58, reducing the potential difference between the conduction band and the valance band of the overlap region, as well as the barrier for valance electrons to reach the conduction band and generate electron-hole pairs. As a result of the more positive voltage applied to the third doped region 50 compared to the N-well potential, the generated electrons are repelled into the channel region of the storage transistor 64, impacting the N-type well 44 and generating more electron-hole pairs. Some electrons of the generated electron-hole pairs that have acquired enough energy are injected into the charge storage layer 564 of the storage transistor 64 and finish the writing operation of the memory cell 40.

Please refer to FIG. 9 for a table listing detailed operating voltages adopted in the fourth embodiment according to the present invention. The fourth embodiment is based on the band-to-band tunneling induced electron injection mechanism. As shown in FIG. 9, the P-type channel between the first and second doped regions can be turned off by the voltages applied to the first gate (method 1 and 2), or by keeping the first doped region at a floating voltage level (method 3). Method 2 adopts operating voltages, each of which is 5V higher than the corresponding operating voltage adopted in method 1. Therefore, all operating voltages adopted in method 2 are higher than ground level, resulting in easier chip implementation. In the fourth embodiment of the present invention, the voltage difference between the second gate 58 and the third doped region 50 is larger than that in the operation based on the channel-hot-hole induced hot-electron injection mechanism. By bending the energy band, electron-hole pairs can be generated based on the band-to-band tunneling mechanism. Therefore, electrons are injected into the charge storage layer 564 of the storage transistor 64 by subsequent impact ionization.

Also, the two physical mechanisms, the channel-hot-hole induced hot-electron injection and the band-to-band tunneling induced electron injection, may not be distinguishable and both can take place at the same time or one after the other. For example, in the first and second embodiments, the band-to-band tunneling induced hot-electron injection can take place first. Certain electrons may be injected into the stack dielectric layer, reducing the bending of the energy band and the band-to-band tunneling induced electron injection. On the other hand, the P-type channel between the second and third doped regions conducts better due to electron injection caused by the band-to-band tunneling induced hot-electron injection that takes place first, and the channel-hot-hole induced hot-electron injection will ensue and dominate the major part of the writing operation. The fourth embodiment is further characterized in that the P-type channel between the first and second doped regions 46 and 48 can stay in OFF-state (it can be turned off by the voltage applied to the first gate, or by keeping the first doped region 46 at a floating voltage level), while in the first and second embodiments the P-type channel between the first and second doped regions 46 and 48 must be conducting.

Figure 10:
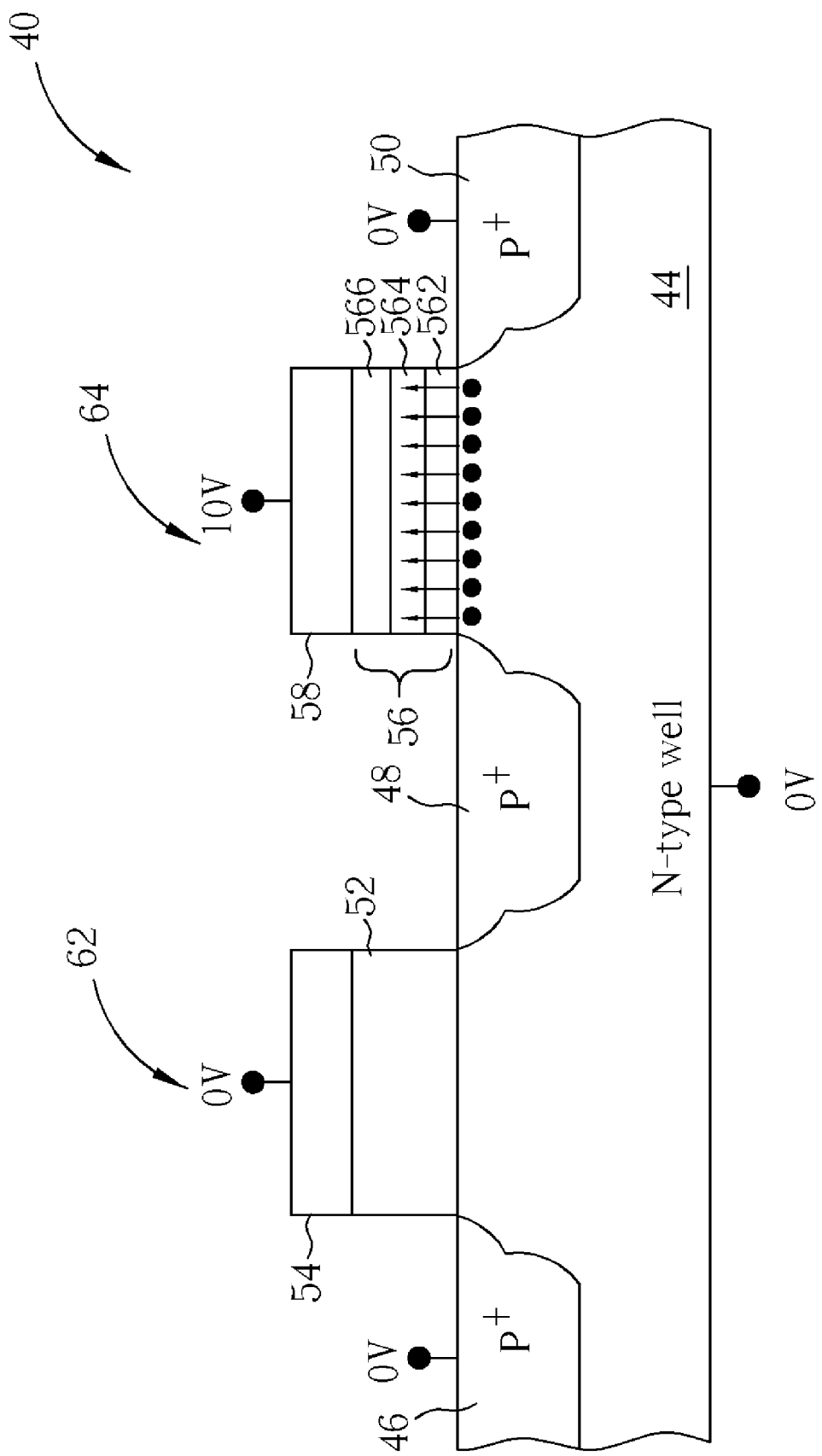
FIG. 10 is a diagram illustrating a method of writing to a memory cell according to a fifth embodiment of the present invention.

Please refer to FIG. 10 for a diagram illustrating a fifth embodiment according to the present invention. In the fifth embodiment of the present invention, the writing operation of the memory cell 40 injects electrons into the charge storage layer 564 of the storage transistor 64 by the Fowler-Nordheim tunneling (FN tunneling) mechanism. By applying 0V to the N-type well 44, the first doped region 46, the second doped region 48, and the first gate 54, and by applying 10 V to the second gate 58, a voltage difference of 10 V is established on the charge storage structure 56 of the storage transistor 64 and results in a high electric field in the perpendicular direction. At the same time, electrons attracted by the electric field tunnel into the charge storage layer 564 of the charge storage structure 56 and finish the writing operation of the memory cell 40.

Please refer to FIG. 11 for a table listing detailed operating voltages adopted in the fifth embodiment according to the present invention. The fifth embodiment is based on the Fowler-Nordheim tunneling mechanism, characterized in that a sufficient voltage is applied to the second gate 58 and the N-type well 44 so that electrons in the N-type well 44 can tunnel into the charge storage layer 564 by Fowler-Nordheim tunneling. Voltages are applied to the first gate 54, the first doped region 46 or the third doped region 50 in a way that does not result in too much current during the programming operation, as shown method 1–4 of FIG. 11.

The difference between the fourth and fifth embodiments of the present invention is that in the fourth embodiment, a sufficient electrical field has to be established between the third doped region 50 and the N-type well 44 for enhancing the impact between the electron-hole pairs generated by the band-to-band tunneling and thus accelerating electron injection, while in the fifth embodiment, the third doped region 50 and the N-type well 44 can have the same voltage.

Figure 12:
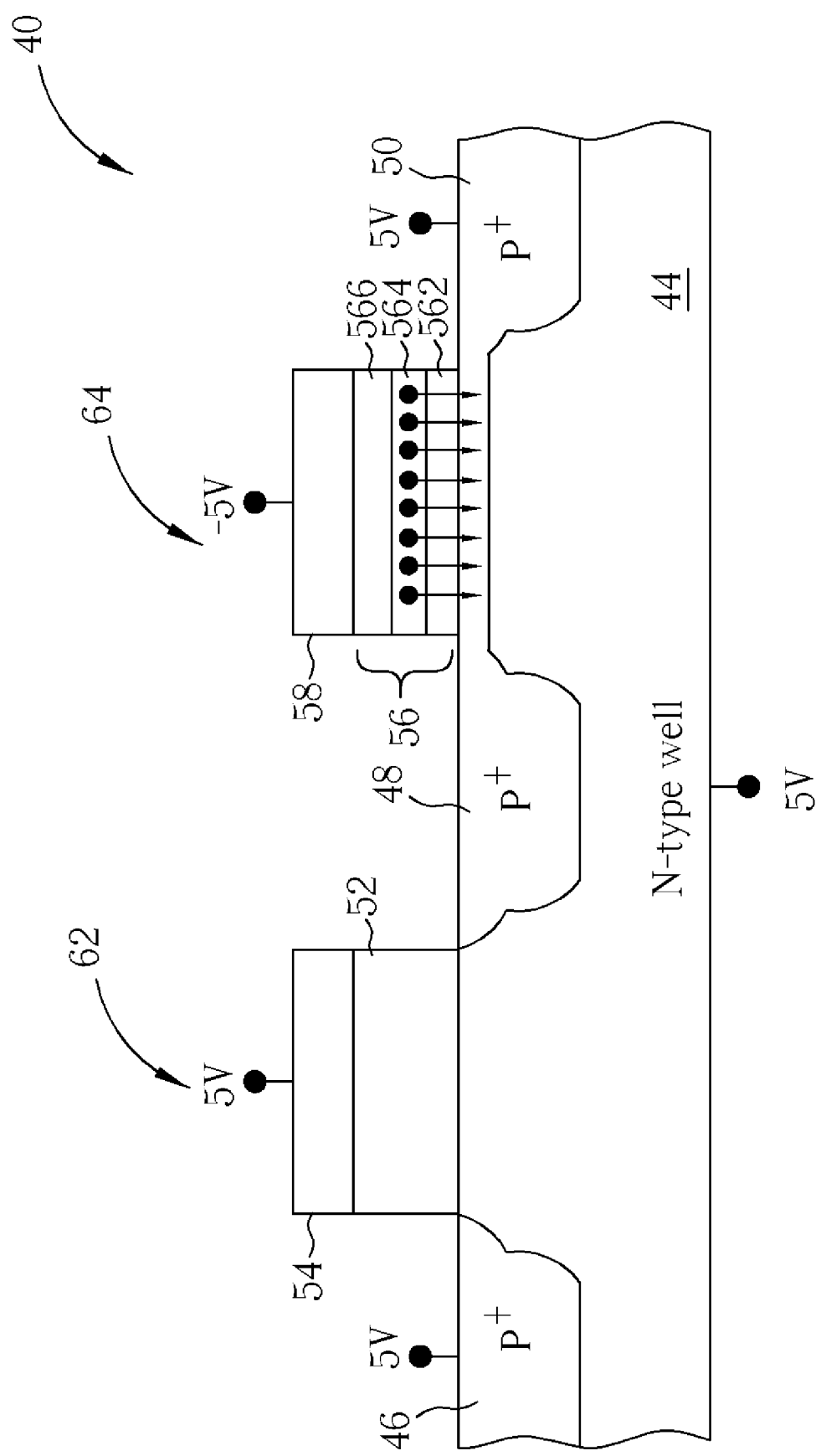
FIG. 12 is a diagram illustrating a method of erasing a memory cell according to a sixth embodiment of the present invention.

Please refer to FIG. 12 for a diagram illustrating a sixth embodiment according to the present invention, during which the charges in the storage transistor 64 of the memory cell 40 are being erased. As shown in FIG. 12, the erasing operation of the memory cell 40 is based on the Fowler-Nordheim tunneling mechanism. By applying 5V to the N-type well 44, the first doped region 46, the third doped region 50, and the first gate 54, and by applying −5 V to the second gate 58, a voltage difference of 10 V is established on the charge storage structure 56 of the storage transistor 64 for expelling electrons confined in the storage layer 564 of the charge storage structure 56.

Please refer to FIG. 13 for a table listing detailed operating voltages adopted in the sixth embodiment according to the present invention. The sixth embodiment is based on the Fowler-Nordheim tunneling mechanism, characterized in that a sufficient voltage is applied to the second gate 58 and the N-type well 44 and electrons in the charge storage layer 564 can tunnel into the N-type well 44 by the Fowler-Nordheim tunneling. Voltages are applied to the first gate 54, the first doped region 46 or the third doped region 50 in a way that does not result in too much current during electron injection, as shown method 1–3 of FIG. 13.

Figure 14:
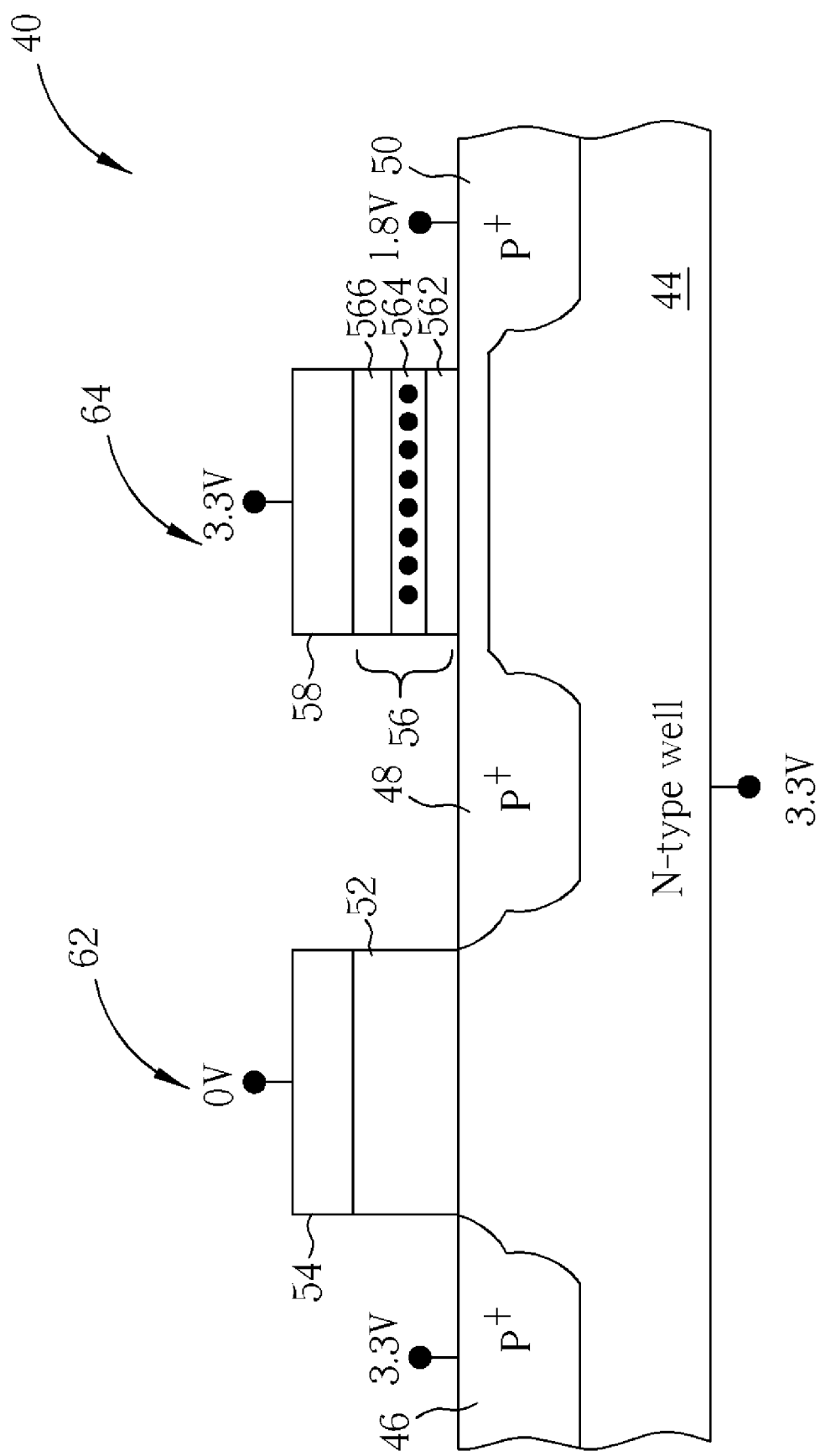
FIG. 14 is a diagram illustrating a method of reading a memory cell according to a seventh embodiment of the present invention.

Please refer to FIG. 14 for a diagram illustrating a seventh embodiment according to the present invention, in which the memory cell 40 is being read. In the seventh embodiment of the present invention, a voltage of 3.3V is applied to the N-type well 44 and the first doped region 46, 1.8V to the third doped region 50, 0V to the first gate 54 for turning on the select transistor, and 3.3 V is applied to the second gate 58. If electrons are stored in the charge storage structure 56 of the storage transistor 64, then the P-type channel of the second and third doped regions 48 and 50 will be conducting, generating current as a result of the voltage difference between the first and third doped regions 46 and 50. If no electron is stored in the charge storage structure 56 of the storage transistor 64, then the P-type channel of the second and third doped regions will be turned off and no current flows through the first and third doped regions 46 and 50.

Please refer to FIG. 15 for a table listing detailed operating voltages adopted in the seventh embodiment according to the present invention. The seventh embodiment is characterized by the conduction of the P-type channel between the first and second doped regions 46 and 48. The voltage applied to the second gate 58 can be set in a way such that whether or not electrons are stored in the charge storage structure 56 can be determined.

In the present invention, data is stored in the storage transistor having the charge storage structure by injecting electrons into the charge storage layer of the storage transistor by the channel-hot-hole induced hot-electron injection mechanism, the band-to-band tunneling induced electron injection mechanism, and the Fowler-Nordheim tunneling mechanism. Also, the present invention provides methods for erasing data stored in the storage transistor by expelling electrons from the charge storage layer based on the Fowler-Nordheim tunneling mechanism, as well as for reading data stored in the storage transistor. Therefore, the present invention discloses a complete operation method for a non-volatile memory device. In contrast to the prior art, the memory cell of the present invention includes a storage transistor and a select transistor coupled in series. Both transistors are PMOS transistors with simple structure, occupy small circuit space and can be manufactured easily in common CMOS processes known to those skilled in the art. The present invention provides a low-cost embedded non-volatile memory that can easily be integrated into other logic, high-voltage, or low-power processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
   an N-type well;
   three P-type doped regions formed on the N-type well;
   a dielectric layer comprising silicon dioxide, formed on the N-type well and between first and second doped regions of the three P-type doped regions;
   a first gate formed on the dielectric layer;
   a charge storage structure formed on the N-type well and between the second and third doped regions of the three P-type doped regions, wherein the charge storage structure stores charges and thereby changes a threshold voltage required for conducting a P-type channel between the second and third doped regions, the charge storage structure comprising:
      a first silicon dioxide layer formed on the N-type well;
      a charge storage layer formed on the first silicon dioxide layer and comprising silicon nitride ($Si_3N_4$) or silicon oxynitride ($Si_xN_yO_z$); and
      a second silicon dioxide layer formed on the charge storage layer; and
   a second gate formed on the charge storage structure.

2. A method for writing to a memory cell comprising:
   providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between a second and third doped regions of the three P-type doped regions, and a second gate formed on the charge storage structure;
   applying a first voltage to the first gate and a second voltage to the second gate for conducting the first and second doped regions;
   applying a third voltage to the N-type well and a fourth voltage to the first doped region; and
   applying a fifth voltage to the third doped region for injecting electrons in a P-type channel of the second and third doped regions into the charge storage structure by channel-hot-hole induced hot-electron injection.

3. The method of claim 2 wherein the first voltage is smaller than or equal to the second voltage.

4. The method of claim 2 wherein the third voltage is equal to the fourth voltage.

5. The method of claim 2 wherein the third voltage is larger than the second voltage.

6. The method of claim 2 wherein the fifth voltage is smaller than the second voltage.

7. The method of claim 2 wherein by applying the first through fifth voltages, electrons are injected into the charge storage structure by channel-hot-hole induced hot-electron injection together with band-to-band tunneling induced electron injection.

8. The method of claim 2 wherein the charge storage structure comprises:
   a first silicon dioxide layer formed on the N-type well;
   a charge storage layer formed on the first silicon dioxide layer; and
   a second silicon dioxide layer formed on the charge storage layer.

9. The method of claim 8 wherein charge storage layer includes silicon nitride ($Si_3N_4$) or silicon oxynitride ($Si_xN_yO_z$).

10. A method for writing to a memory cell comprising:
    providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between a second and third doped regions of the three P-type doped regions, and a second gate formed on the charge storage structure;
    applying a first voltage to the first gate and a second voltage to the second gate;
    applying a voltage to the N-type well;
    applying a third voltage to the first doped region, adjusting the first voltage for turning off a P-type channel between the first and second doped regions, or for providing the first doped region with a floating voltage level, wherein no current flows through the P-type channel between the first and second doped regions when the third voltage is applied to the first doped region; and
    applying a voltage smaller than the second voltage to the third doped region, thereby generating a horizontal electric field for accelerating electrons generated in the third doped region by band-to-band tunneling mechanism and providing the electrons with sufficient energy for entering a P-type channel between the second and third doped regions, and for injecting electrons into the charge storage structure by electron-hole pairs resulting from electrons impacting the P-type channel between the second and third doped regions.

11. The method of claim 10 wherein the first voltage is smaller than the second voltage.

12. The method of claim 10 wherein when the first doped region is not at a floating voltage level, the first and second voltages are not smaller than the voltages applied to the N-type well and the first doped region.

13. The method of claim 10 wherein the charge storage structure comprises:
    a first silicon dioxide layer formed on the N-type well;
    a charge storage layer formed on the first silicon dioxide layer; and
    a second silicon dioxide layer formed on the charge storage layer.

14. The method of claim 13 wherein charge storage layer includes silicon nitride ($Si_3N_4$) or silicon oxynitride ($Si_xN_yO_z$).

15. A method for writing to a memory cell comprising:
    providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure;

applying voltages to the N-type well, the first and the third doped regions;

applying a first voltage to the first gate for turning off a P-type channel between the first and second doped regions; and applying a second voltage to the second gate for providing the charge storage structure with a sufficient electrical field to attract electrons in a P-type channel between the second and third doped regions, and for tunneling electrons in the P-type channel between the second and third doped regions into the charge storage structure by Fowler-Nordheim tunneling, wherein the second voltage is larger than the voltage applied to the N-type well.

16. The method of claim 15 wherein the first voltage is smaller than the second voltage.

17. The method of claim 15 wherein the first voltage is equal to the voltages applied to the N-type well, the first and the third doped regions, or further comprising providing the third doped region with a floating voltage level.

18. The method of claim 15 wherein the charge storage structure comprises:
   a first silicon dioxide layer formed on the N-type well;
   a charge storage layer formed on the first silicon dioxide layer; and
   a second silicon dioxide layer formed on the charge storage layer.

19. The method of claim 18 wherein charge storage layer includes silicon nitride ($Si_3N_4$) or silicon oxynitride ($Si_xN_yO_z$).

20. A method for erasing a memory cell comprising:
   providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure;
   applying voltages to the N-type well, the first and the third doped regions;
   applying a first voltage to the first gate; and
   applying a second voltage to the second gate for conducting a P-type channel between the second and third doped regions and establishing a voltage difference between the second gate and the N-type well for erasing electrons from the charge storage structure by Fowler-Nordheim tunneling, wherein the second voltage is smaller than the voltage applied to the N-type well.

21. The method of claim 20 wherein the first voltage is larger than the second voltage.

22. The method of claim 20 wherein a same voltage is applied to the N-type well and the first and the third doped regions.

23. The method of claim 20 wherein the first voltage is applied for conducting the P-type channel between a first and second doped regions, and further comprising providing the third doped region with a floating voltage level.

24. The method of claim 20 wherein the charge storage structure comprises:
   a first silicon dioxide layer formed on the N-type well;
   a charge storage layer formed on the first silicon dioxide layer; and
   a second silicon dioxide layer formed on the charge storage layer.

25. The method of claim 24 wherein charge storage layer includes silicon nitride ($Si_3N_4$) or silicon oxynitride ($Si_xN_yO_z$).

26. A method for reading a memory cell comprising:
   providing a memory cell comprising an N-type well, three P-type doped regions formed on the N-type well, a dielectric layer comprising silicon dioxide and formed on the N-type well and between first and second doped regions of the three P-type doped regions, a first gate formed on the dielectric layer, a charge storage structure formed on the N-type well and between second and third doped regions of the three P-type doped regions, and a second gate formed on the charge storage structure;
   applying voltages to the N-type well, the first and the third doped regions, wherein the first and third doped regions have different voltages;
   applying a first voltage to the first gate for conducting a P-type channel between the first and second doped regions; and
   applying a second voltage to the second gate, wherein the second voltage is set in a way such that whether or not electrons are stored in the charge storage structure can be determined when reading the memory cell.

27. The method of claim 26 wherein the second voltage and the voltage of the N-type well are at a same voltage level.

28. The method of claim 26 wherein the charge storage structure comprises:
   a first silicon dioxide layer formed on the N-type well;
   a charge storage layer formed on the first silicon dioxide layer; and
   a second silicon dioxide layer formed on the charge storage layer.

29. The method of claim 28 wherein charge storage layer includes silicon nitride ($Si_3N_4$) or silicon oxynitride ($Si_xN_yO_z$).

* * * * *

UNITED STATES PATENT AND TRADEMARK OFFICE
CERTIFICATE OF CORRECTION

PATENT NO. : 7,190,623 B2 Page 1 of 1
APPLICATION NO. : 11/161951
DATED : March 13, 2007
INVENTOR(S) : Ching-Hsiang Hsu et al.

It is certified that error appears in the above-identified patent and that said Letters Patent is hereby corrected as shown below:

On the title page item(73), correct the name of the assignee from "eMemory Technologies Inc." to --eMemory Technology Inc.--

Signed and Sealed this

Twenty-ninth Day of May, 2007

JON W. DUDAS
*Director of the United States Patent and Trademark Office*